United States Patent
Hayashi (10) Patent No.: US 10,434,592 B2
(45) Date of Patent: Oct. 8, 2019

(54) FLUX APPLYING APPARATUS (71) Applicant: Fujitsu Ten Limited, Kobe-shi (JP)

(72) Inventor: Hisaki Hayashi, Kobe (JP)

(73) Assignee: FUJITSU TEN LIMITED, Kobe-Shi (JP)

( * ) Notice: Subject to any disclaimer, the term of this patent is extended or adjusted under 35 U.S.C. 154(b) by 1 day.

(21) Appl. No.: 15/620,031

(22) Filed: Jun. 12, 2017

(65) Prior Publication Data

US 2018/0001408 A1   Jan. 4, 2018

(30) Foreign Application Priority Data

Jun. 29, 2016 (JP) ................... 2016-128324

(51) Int. Cl.
| | | |
|---|---|---|
| B23K 1/20 | (2006.01) |
| H05K 3/34 | (2006.01) |
| B23K 3/08 | (2006.01) |
| B05B 7/00 | (2006.01) |
| B05D 1/02 | (2006.01) |
| B23K 3/06 | (2006.01) |
| B05B 7/24 | (2006.01) |
| B23K 1/08 | (2006.01) |
| B23K 101/42 | (2006.01) |

(52) U.S. Cl.
CPC ............ B23K 1/203 (2013.01); B05B 7/0075 (2013.01); B05D 1/02 (2013.01); B23K 1/206 (2013.01); B23K 3/082 (2013.01); H05K 3/3489 (2013.01); B05B 7/24 (2013.01); B23K 1/08 (2013.01); B23K 3/0653 (2013.01); B23K 2101/42 (2018.08)

(58) Field of Classification Search
None
See application file for complete search history.

(56) References Cited

U.S. PATENT DOCUMENTS

| | | | | |
|---|---|---|---|---|
| 5,145,531 A | * | 9/1992 | Turner .................. | B23K 1/203 148/23 |
| 2002/0017552 A1 | * | 2/2002 | Ishida .................... | B23K 3/082 228/207 |
| 2016/0075144 A1 | * | 3/2016 | Sugitani ............... | B41J 2/17596 347/6 |
| 2018/0001410 A1 | * | 1/2018 | Hayashi ................ | B23K 1/203 |

FOREIGN PATENT DOCUMENTS

| | | |
|---|---|---|
| CN | 203765132 U | 8/2014 |
| CN | 204842087 U | 12/2015 |
| JP | 11-192717 A | 7/1999 |
| JP | 2005-262247 A | 9/2005 |

* cited by examiner

*Primary Examiner* — Binu Thomas
(74) *Attorney, Agent, or Firm* — Seed Intellectual Property Law Group LLP (57) ABSTRACT

There is provided a flux applying apparatus configured to jet and apply a flux to a target, whereby the flux applying apparatus is capable of rapidly collecting a surplus flux in a sub-tank and returning the same to the main tank for further jetting and applying. In particular, the flux applying apparatus is coupled to a control unit capable of estimating a flux amount trapped in the sub-tank on the basis of a time period for which the flux is to be jetted from the nozzle.

4 Claims, 6 Drawing Sheets

FLUX APPLYING APPARATUS

CROSS-REFERENCE TO RELATED APPLICATIONS

This application is based on and claims priority from Japanese Patent Application No. 2016-128324 filed on Jun. 29, 2016.

TECHNICAL FIELD

The disclosure relates to a technology of applying a flux to a board on which electronic components are to be mounted.

RELATED ART

In the related art, a soldering has been widely used as a method of bonding metal components such as lands and through-holes formed on a surface of a printed board and lead lines of mounted components such as a semiconductor device and a capacitor mounted on the board so that energization can be enabled. As a pre-process of the soldering, a flux solution is applied. The flux solution is a liquid in which a rosin-based or acryl-based resin, an alcohol or aromatic solvent and an activator are mixed. The flux solution is uniformly applied to places in advance, at which the metal components and the mounted components are to be bonded by the soldering, on the printed board by a spray or the like, so that an oxide layer formed on the target places becomes reduced or removed. As a result, a clean adhesion surface is formed, wettability between the soldering and the metal surface is improved and the bonding becomes strong.

In order to uniformly apply the flux solution to the applying target, a method of injecting the flux solution in a mist form by using a spray has been widely used. In general, the spray is configured to inject compressed liquid from an injection port (orifice) of a nozzle tip and to form the liquid into fine particles, thereby injecting the mist.

Meanwhile, in order to inject the liquid in the mist form, a pressure (injection pressure) by which the liquid is to be introduced into the nozzle should be a predetermined pressure or higher. A flying distance (reaching distance) and a spreading angle (spraying angle) of the mist to be injected from the injection port depend on the injection pressure, so that they increase as the injection pressure increases. Therefore, in general, when injecting the flux by using the spray, it is not possible to make the reaching distance and spraying angle of the flux solution to be injected smaller than predetermined values.

However, when injecting and applying the flux to the through-holes of the board by using the spray, the reaching distance becomes excessively long, so that the flux may pass through the through-holes, which are the applying target, and may be introduced into the components on the board. Also, the spraying angle becomes excessively large, so that the flux injected over a wide range may be unintentionally attached to the mounted components, which are not the applying target. In this case, in a rotary encoder to be used for a dial for volume adjustment of an audio product, for example, the flux may be introduced into a component, so that a malfunction may be caused.

Therefore, as a method of uniformly applying a necessary amount of flux into the through-holes of the printed board without using the spray, a method of using a flux applying apparatus of Patent Document 1 has been known, for example. The flux applying apparatus disclosed in Patent Document 1 is configured to jet a flux reserved in a nozzle from an upward opening and to bring a liquid surface of the jetted flux into contact with the board, thereby applying the flux to the board.

Patent Document 1: Japanese Patent Application Publication No. 2005-262247A

According to the method of using the flux applying apparatus disclosed in Patent Document 1, a pump is provided on the way of a flow path for sending the flux to the nozzle and the flux is pneumatically transported, so that the flux is jetted from the nozzle. When the pump is provided on the flow path of the flux, in this way, pulsation is caused in the flux and an impeller of the pump is fixed.

Also, according to the method of using the flux applying apparatus disclosed in Patent Document 1, the surplus flux jetted from the nozzle is received on a tray and is returned to a tank via a return piping. At this time, when the surplus flux is just naturally dropped from the tray to the tank, it takes time for the surplus flux to return to the tank, so that the waiting time until a next jetting is lengthened. When the waiting time until the next jetting is excessively lengthened, the speed in a manufacturing process is lowered and the staying time of the flux in the tray is lengthened, so that the flux is deteriorated due to volatilization of a solvent or the like.

SUMMARY

It is therefore an object of the disclosure is to provide a technology of rapidly collecting a surplus flux jetted from a nozzle into a tank when applying a flux.

According to an aspect of the embodiments of the present invention, there is provided a flux applying apparatus configured to jet and apply a flux to a target, the flux applying apparatus comprising: a main tank configured to accommodate therein the flux; a feed pipe configured to pass therethrough the flux which is to be pneumatically transported with a gas pressure when an inside of the main tank is at a positive pressure; a nozzle configured to jet the flux transported via the feed pipe; a sub-tank configured to trap therein the flux jetted from the nozzle; and a return pipe configured to communicate the sub-tank and the main tank each other and to return the flux to the main tank with a gas pressure when the inside of the main tank is at a negative pressure.

By the above configuration, instead of waiting that the surplus flux trapped in the sub-tank returns to the main tank by the natural drop, the flux is sucked by applying the negative pressure in the main tank, so that it is possible to rapidly collect the flux from the sub-tank. Also, thereby, since it is possible to rapidly make preparations for a next applying, it is possible to speed up the manufacturing process. Also, it is possible to shorten the staying time of the flux in the sub-tank, so that it is possible to suppress deterioration of the flux resulting from volatilization of a solvent or the like at a minimum, thereby improving the reliability of the manufacturing process.

According to the disclosure, it is possible to provide the technology of rapidly collecting the surplus flux jetted from the nozzle into the tank when applying the flux.

BRIEF DESCRIPTION OF THE DRAWINGS

Exemplary embodiments of the present invention will be described in detailed based on the following figures, wherein.

DETAILED DESCRIPTION

Hereinafter, illustrative embodiments of the disclosure will be described with reference to the drawings. The configurations of the illustrative embodiments are just exemplary and the disclosure is not limited thereto.

First Illustrative Embodiment

<Apparatus Configuration>

Figure 1:
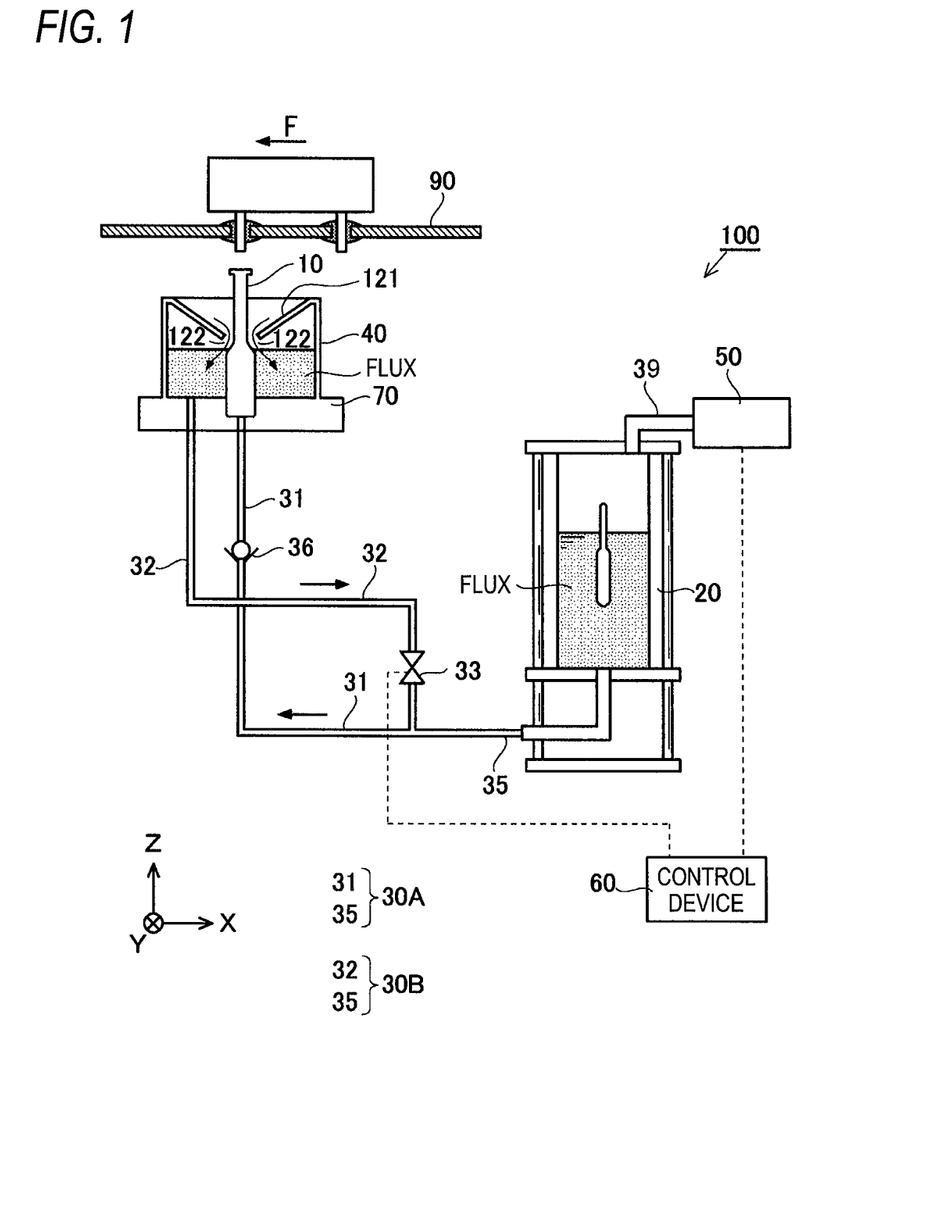
FIG. 1 depicts a configuration of a flux applying apparatus in accordance with a first illustrative embodiment.

FIG. 1 depicts a configuration of a flux applying apparatus 100 in accordance with a first illustrative embodiment. As shown in FIG. 1, the flux applying apparatus 100 has a nozzle 10, a main tank 20, a feed piping 31, a return piping 32, an opening and closing valve 33, a piping 35, a sub-tank 40, a pressurization/depressurization device 50, a control device 60 and a base 70.

The nozzle 10 is a cylindrical member and is set on the base 70 at a state where a tip portion having an opening (not shown) configured to discharge a flux faces upwards. Also, a rear end portion of the nozzle 10 is connected with the feed piping 31.

The sub-tank 40 is provided with an opening configured to collect the flux facing upwards and has an outer diameter of a circular shape, as seen from a plan view (X-Y plane in FIG. 1), and the nozzle 10 is provided at a center thereof. Also, an upper part of the sub-tank 40 is provided with a cover part 121 having a mortar shape and inclined downwards from an outer periphery towards a central part, and a central portion of the cover part 121 is provided with an opening 122 configured to trap the flux.

The base 70 may be held at a movement unit (not shown) so as to be moveable in a vertical direction (Z-axis direction in FIG. 1) and in a horizontal direction (X-Y direction).

The main tank 20 is a tank configured to accommodate therein the flux, has a cylindrical shape of which an internal space configured to accommodate therein the flux is long in the vertical direction, is connected at its upper part with the pressurization/depressurization piping 39, and is connected at its lower part with the piping 35. In addition, the main tank 20 has a charging port (not shown) of the flux but is sealed except for the piping 35 and the pressurization/depressurization piping 39 when applying the flux.

The piping 35 has one end connected to the main tank 20 and the other end connected to the feed piping 31 and the return piping 32. In other words, the piping 35 is branched into the feed piping 31 and the return piping 32 at an opposite end portion to the main tank 20.

A check valve 36 is provided on the way of the feed piping 31. The check valve 36 is opened when the flux is pneumatically transported from the main tank 20 and is supplied to the nozzle 10, and is closed when the flux is not pneumatically transported towards the nozzle 10, so that it prevents the flux from flowing back from the nozzle 10 towards the main tank 20.

Also, the opening and closing valve 33 is provided on the way of the return piping 32. The opening and closing valve 33 is opened when returning the flux from the sub-tank 40 to the main tank 20 via the return piping 32 and the piping 35 and is closed when sending the flux from the main tank 20 to the nozzle 10 via the piping 35 and the feed piping 31. The opening and closing valve 33 is an electromagnetic valve having a driving unit configured to open and close the same under control of the control device 60, for example. In the meantime, the opening and closing valve 33 may be a check valve that is closed by a pressure of the flux when the flux is pneumatically transported from the main tank 20 and is supplied to the nozzle 10 and is opened when the flux is collected from the nozzle 10 towards the main tank 20, not the electromagnetic valve.

Like this, the piping 35 and the feed piping 31 configure an example of a feed pipe 30A for supplying the flux from the main tank 20 to the nozzle 10. Also, the return piping 32 and the piping 35 configure an example of a return pipe 30B for returning the flux from the sub-tank 40 to the main tank 20.

The pressurization/depressurization piping 39 has one end connected to the main tank 20 and the other end connected to the pressurization/depressurization device 50. The pressurization/depressurization device 50 is configured to pressurize an inside of the main tank 20 by sending a gas to the main tank 20 via the pressurization/depressurization piping 39. Also, the pressurization/depressurization device 50 50 is configured to depressurize the inside of the main tank 20 by sucking the gas from the main tank 20 via the pressurization/depressurization piping 39. Also, the pressurization/depressurization device 50 can enable the inside of the main tank 20 to be at a state where the pressurization and the depressurization are not performed, i.e., at the same pressure as a surrounding environment. For example, a pressure in the main tank 20 is set to an atmospheric pressure by enabling the inside and outside of the main tank 20 to communicate with each other. In the first illustrative embodiment, the air is used as the gas that is to be used for pressurization and depressurization. However, the gas is not limited to the air and other gases such as nitrogen can also be used.

The pressurization/depressurization device 50 includes a device (blowing device) configured to transport the air, such as a compressor, a blower, a syringe pump or the like, for example, and is configured to operate the blowing device to send the air to the main tank 20, thereby performing the pressurization. At this time, the pressurization/depressurization device 50 can apply a predetermined gas pressure in the main tank 20 by adjusting an operation of the blowing device or adjusting a pressure adjustment valve (not shown) provided on a flow path of the air to be sent. By the pressurization, the pressurization/depressurization device 50 is configured to set the pressure in the main tank 20 to 4 to 100 kPa, for example.

Also, the pressurization/depressurization device 50 has a device (vacuum generator) configured to suck the air, such as a vacuum ejector, a vacuum pump, a vacuum blower, a syringe pump or the like, for example, and is configured to operate the vacuum generator to suck the air from the main tank 20, thereby performing the depressurization. At this time, the pressurization/depressurization device 50 can form a predetermined negative pressure in the main tank 20 by adjusting an operation of the vacuum generator. For example, the pressurization/depressurization device 50 is configured to set the pressure in the main tank 20 to −80 to −300 kPa, for example. In the meantime, the numerical value of the pressure may be determined as an absolute value. However, in the first illustrative embodiment, the numerical value of the pressure is determined as a relative value on the basis of the atmospheric pressure, rather than the absolute value.

In the first illustrative embodiment, the pressurization/depressurization device 50 and the main tank 20 are connected to each other by the pressurization/depressurization piping 39, a path along which the pressurization is to be performed and a path along which the depressurization is to be performed are configured by one path so as to simplify the device. However, the disclosure is not limited thereto, and a piping for pressurization and a piping for depressurization may be respectively provided between the pressurization/depressurization device 50 and the main tank 20.

The control device 60 is electrically connected to the opening and closing valve 33 and the pressurization/depressurization device 50 and is configured to control the opening and closing operation of the opening and closing valve 33 and the pressurization and depressurization operation of the pressurization/depressurization device 50.

Figure 2:
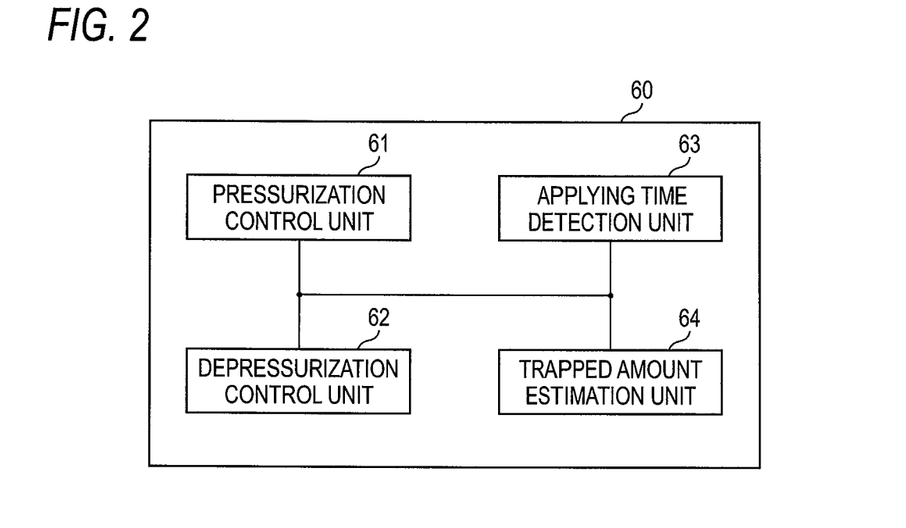
FIG. 2 depicts a functional block of a control device.

FIG. 2 depicts a function block of the control device 60. As shown in FIG. 2, the control device 60 has a pressurization control unit 61, a depressurization control unit 62, an applying time detection unit 63 and a trapped amount estimation unit 64.

The pressurization control unit 61 is configured to perform control of transmitting a control signal to the pressurization/depressurization device 50 to start the pressurization for setting the inside of the main tank 20 to a predetermined gas pressure (positive pressure) or to stop the pressurization, for example.

The depressurization control unit 62 is configured to perform control of transmitting a control signal to the pressurization/depressurization device 50 to start the depressurization for setting the inside of the main tank 20 to a predetermined negative pressure or to stop the depressurization for setting the inside of the main tank 20 to the atmospheric pressure, for example.

The applying time detection unit 63 is configured to detect a time period for which the flux has been jetted (hereinafter, referred to as jetting time), i.e., a time period after the jetting of the flux starts until the jetting is over, as the jetting time. For example, the applying time detection unit 63 is configured to detect a time period from starting time to ending time of the pressurization by the pressurization/depressurization device 50.

The trapped amount estimation unit 64 is configured to estimate a flux amount trapped in the sub-tank on the basis of the jetting time and to set a time period (hereinafter, referred to as negative pressure generation time) for which the inside of the main tank is set to the negative pressure, based on the estimated flux amount. The depressurization control unit 62 is configured to start the depressurization for setting the inside of the main tank 20 to a predetermined negative pressure and to stop the depressurization when elapse time from the start of the depressurization reaches the negative pressure generation time.

The trapped amount estimation unit 64 is configured to obtain the negative pressure generation time, based on a following equation 1, for example.

(negative pressure generation time $T$)=$k$×(jetting time $t$)+$\alpha$ (equation 1)

In the equation 1, the coefficient k is a value relating to a flow rate of the flux, which is to be set on the basis of a diameter of the injection port of the nozzle 10, a pressure (positive pressure) to be applied to the main tank 20, a viscosity of the flux and the like. Also, the constant $\alpha$ is a value relating to collection time that is normally required for one time collection set on the basis of a length and a diameter of a flow path of the flux, an internal capacity of the main tank 20 and the like. In the first illustrative embodiment, the coefficient k is 0.13 and the constant $\alpha$ is 1.79.

(negative pressure generation time $T$)=0.13×(jetting time $t$)+1.79

Therefore, when the jetting time t is 60 seconds, the negative pressure generation time T is 9.59 seconds.

Figure 3:
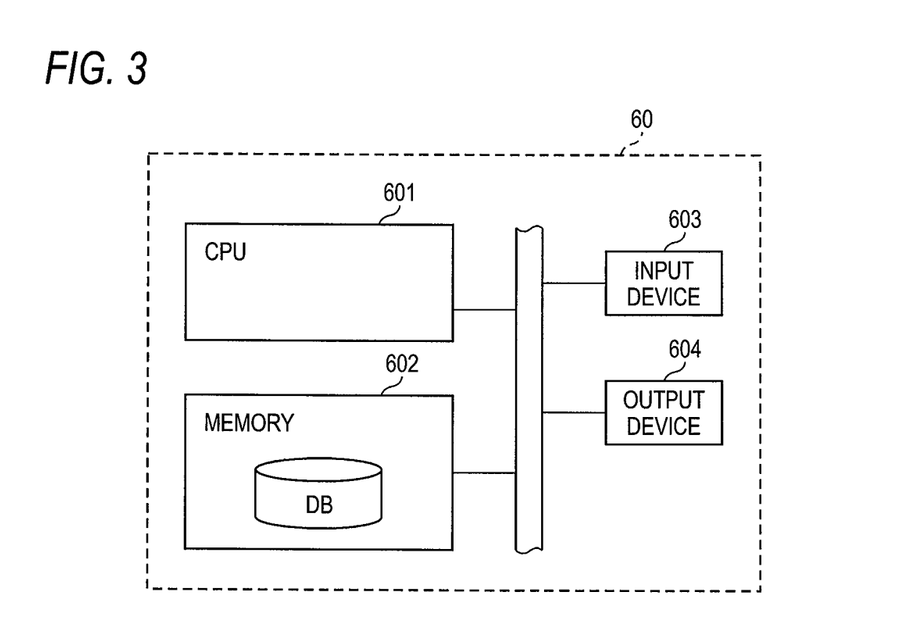
FIG. 3 depicts a hardware configuration of the control device.

FIG. 3 depicts a hardware configuration of the control device 60. As shown in FIG. 3, the control device 60 includes a memory 602, an input device 603 and an output device 604, which are connected to a CPU 601 via a bus.

The memory 602 includes a main storage device and an auxiliary storage device. The main storage device is used as a work area of the CPU 601, a storage area of programs and data, and a buffer area of communication data. The main storage device is configured by a Random Access Memory (RAM) or a combination of the RAM and a Read Only Memory (ROM).

The auxiliary storage device is configured to store therein a program that is to be executed by the CPU 601 and data that is to be used when executing the program. The auxiliary storage device is a hard disk drive (HDD), a Solid State Drive (SSD), a flash memory, an Electrically Erasable Programmable Read-Only Memory (EEPROM) or the like, for example. Also, the auxiliary storage device includes a portable storage medium that is to be detachably mounted to the control device 60.

The input device 603 is used so as to input setting information and data to the control device 60. The input device 603 may include a button, a key, a touch panel, a jumper, a variable resistor and the like.

The output device 604 is configured to output the information and the data. The output device 604 is a display device, a writing device to a storage medium, a speaker, an indicator, a warning lamp or the like, for example.

Some of the above configurations may be omitted or a configuration may be added, as necessary. For example, when it is not necessary to output the information, the output device 604 may be omitted. Also, when performing communication with other apparatus, when inputting the setting information and the like from the other apparatus or when transmitting information such as operating status to the other apparatus, a communication interface may be added.

In the first illustrative embodiment, the CPU 601 corresponds to a processing device. The CPU 601 is also referred to as an MPU (Micro Processor Unit), a microprocessor or a processor. The CPU 601 is not limited to a single processor and may have a multi-processor configuration. Also, a single CPU connected with a single socket may have a multi-core configuration. At least some processing of the respective units may be performed by a processor except for the CPU, for example, a dedicated processor such as a Digital Signal Processor (DSP), a Graphics Processing Unit (GPU), a numeric calculation processor, a vector processor, an image processing processor or the like. Also, at least some processing of the respective units may be performed by an integrated circuit (IC) or other digital circuit. Also, at least some of the respective units may include an analog circuit. The integrated circuit includes an LSI, an Application Specific Integrated Circuit (ASIC) and a programmable logic device (PLD). The PLD includes a Field-Programmable Gate Array (FPGA), for example. Each unit may be a combination of a processor and an integrated circuit. The combination is also referred to as an MCU (Micro Controller Unit), a SoC (System-on-a-chip), a system LSI, a chipset or the like.

The CPU 601 is configured to load a program stored in the memory 602 into the main storage device and to execute the same. In the memory 602, programs such as an operating system, firmware and the like are installed.

The CPU 601 is configured to execute programs, thereby functioning as the pressurization control unit 61, the depressurization control unit 62, the applying time detection unit 63 and the trapped amount estimation unit 64.

<Method of Applying and Collecting Flux>

Subsequently, a method of applying and collecting the flux by the flux applying apparatus 100 of the first illustrative embodiment is described.

The nozzle 10 of the flux applying apparatus 100 is arranged below a printed board 90, which is a target to which the flux is to be applied. When the inside of the main tank 20 is pressurized and the flux is pneumatically transported to the nozzle 10, the flux is jetted upwards from a nozzle tip.

At this time, the flux reaches a position higher than the nozzle tip by a jetting pressure and is then dropped downwards. That is, since the flux jetted from the nozzle 10 forms a jetting stream so as to be convex upwards from the nozzle tip, the jetting stream of the flux is contacted to the target, so that the flux is applied to the target. In the meantime, a flux jetted from the nozzle 10 and not applied to the target (hereinafter, also referred to as surplus flux) is dropped downwards and trapped into the sub-tank 40. For example, after being jetted upwards from the nozzle 10, the surplus flux descends along an outer wall of the nozzle 10 and is accommodated into the sub-tank 40 from the opening 122. Also, after being jetted upwards from the nozzle 10, the surplus flux scattered around the nozzle 10 is dropped onto the cover part 121 of the sub-tank 40 and flows towards the central opening 122 along the inclination of the cover part 121, so that it is accommodated into the sub-tank 40 from the opening 122.

The printed board 90 is conveyed in a predetermined conveying direction F by a conveyor apparatus (not shown) and the nozzle 10 is moved in the X-axis, Y-axis and Z-axis direction by a movement unit (not shown), so that the nozzle is positioned at a predetermined applying position and the applying is repeatedly performed. In the meantime, since the movement unit of the nozzle 10 is well-known, the detailed description thereof is omitted.

When the applying is completed for one printed board 90, the flux trapped in the sub-tank 40 is collected into the main tank 20 until a next printed board is conveyed and the nozzle 10 is moved to a position at which the applying for the printed board starts.

Figure 4:
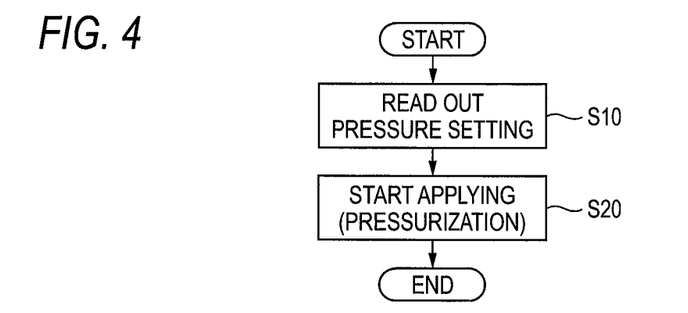
FIG. 4 illustrates processing of starting an applying process.
Figure 5:
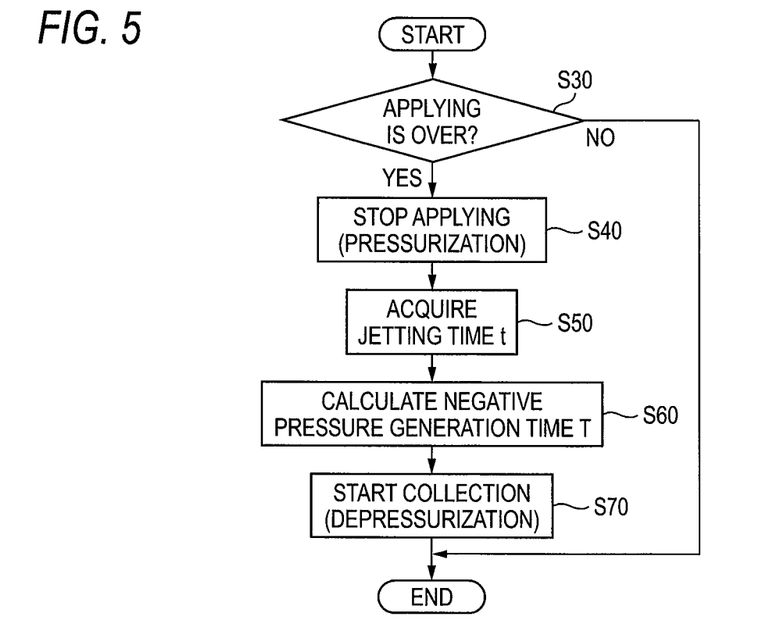
FIG. 5 illustrates processing of starting a collection process of a flux after an ending of the applying is detected.
Figure 6:
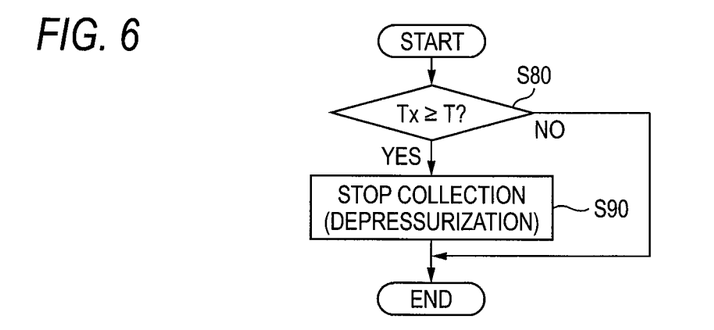
FIG. 6 illustrates processing of ending the collection process of the flux.

FIG. 4 illustrates processing of starting the applying by the control device 60, FIG. 5 illustrates processing of starting collection of the flux when an ending of the applying is detected, and FIG. 6 illustrates processing of ending the collection of the flux.

When it is notified from the movement unit that the nozzle 10 has reached the predetermined applying position, the control device 60 executes the processing of FIG. 4, reads out a setting of a pressure upon pressurization of the main tank 20 from the memory 602 (step S10) and transmits a control signal to the pressurization/depressurization device 50 so as to perform the pressurization with the pressure, thereby starting the pressurization (step S20).

Then, the control device 60 executes the processing of FIG. 5 and determines whether the applying is over (step S30). When it is determined that the applying is over (step S30, Yes), the control device enables the pressurization/depressurization device 50 to stop the pressurization (step S40). Regarding the determination as to whether the applying is over, when it is detected that a predetermined operating state has come as the applying is performed, for example when the elapse time from the start of the applying reaches predetermined time, when it is notified from the movement unit that the nozzle 10 has reached a final applying position or the like, it is determined that the applying is completed. On the other hand, when it is determined in step S30 that the applying is not over (step S30, No), the control device once ends the processing of FIG. 5 and periodically executes the processing of FIG. 5 to monitor whether the applying is over.

After stopping the pressurization in step S40, the control device 60 acquires a time period for which the pressurization has been performed, i.e., the jetting time (step S50). The jetting time is calculated from the time at which the pressurization/depressurization device 50 has been enabled to start the pressurization and the time at which the pressurization/depressurization device 50 has been enabled to stop the pressurization.

The control device 60 estimates the flux amount trapped in the sub-tank 40 on the basis of the jetting time, sets the negative pressure generation time for which the inside of the main tank 20 is to be set to the negative pressure, on the basis of the estimated flux amount (step S60) and enables the pressurization/depressurization device 50 to start the depressurization (step S70). That is, the control device sets the inside of the main tank 20 to the negative pressure and collects the flux in the sub-tank 40 to the main tank 20 via the return piping 32 and the piping 35.

After starting the depressurization, the control device 60 executes the processing of FIG. 6 and determines whether elapse time Tx from the start of the depressurization has reached the negative pressure generation time T set in S60, i.e., whether the collection is over (step S80). When it is determined that the elapse time Tx has not reached the negative pressure generation time T (the collection is not over) (step S80, No), the control device ends the processing of FIG. 6 and periodically executes the processing of FIG. 6 to monitor whether the collection is over.

When it is determined in step S80 that the elapse time Tx has reached the negative pressure generation time T (the collection is over) (step S80, Yes), the control device transmits a control signal for stopping the depressurization to the pressurization/depressurization device 50, stops the depressurization, sets the inside of the main tank 20 to the atmospheric pressure and ends the collection of the flux (step S90). In the meantime, when the inside of the main tank 20 is kept at the negative pressure simply by stopping the depressurization, the inside of the main tank 20 and the outside of the main tank may be made to communicate with each other by using a vacuum breaker or the like so that the inside of the main tank 20 is to be returned to the atmospheric pressure.

<Effects>

As described above, according to the flux applying apparatus of the first illustrative embodiment, the main tank is pressurized or depressurized to pneumatically transport or collect the flux. Therefore, it is not necessary to provide a pump on the flow path of the flux, so that it is possible to prevent the flux from being pulsated and an impeller from being fixed.

Also, according to the flux applying apparatus of the first illustrative embodiment, instead of waiting that the surplus flux trapped in the sub-tank 40 returns to the main tank 20 by the natural dropping, the inside of the main tank 20 is set to the negative pressure to suck the surplus flux, so that it is possible to rapidly collect the surplus flux from the sub-tank 40. Thereby, since it is possible to rapidly make preparations for a next applying, it is possible to speed up the manufacturing process. Also, it is possible to shorten the staying time of the surplus flux in the sub-tank, so that it is possible to suppress deterioration of the flux resulting from volatilization of a solvent or the like at a minimum, thereby improving the reliability of the manufacturing process.

Also, the flux applying apparatus of the first illustrative embodiment is configured to estimate the flux amount trapped in the sub-tank 40 on the basis of the time period (jetting time) for which the flux is jetted from the nozzle 10 and to control the applying time of the negative pressure on the basis of the estimated flux amount, upon the collection of the surplus flux. For example, when collecting the surplus flux, if the inside of the main tank 20 is continuously set to the negative pressure, the air is sucked from a collection tank and the flux flows back to a negative pressure generator. Therefore, in the first illustrative embodiment, it is possible to set the optimal applying time of the negative pressure on the basis of the remaining amount of the flux in the sub-tank 40, to minimize the flux amount in the sub-tank 40 and to prevent the air from being included into the main tank 20. In the meantime, when preventing the air from being included into the main tank 20, a method of stopping the negative pressure before the air is included into the main tank by using a sensor or the like is considered. However, in this case, a malfunction may be caused due to bubbles of the flux, or the like. Regarding this, according to the flux applying apparatus of the first illustrative embodiment, the time period for which the main tank 20 is set to the negative pressure is set on the basis of the jetting time. Therefore, it is not necessary to provide the sensor and to precisely collect a necessary amount of the flux with a simple configuration.

Second Illustrative Embodiment

The above-described flux applying apparatus 100 is configured to pressurize the inside of the main tank 20, thereby pneumatically transporting the flux. Therefore, the time that is to be consumed until the flux to be pneumatically transported reaches a predetermined flow rate is different when the amount of the flux accommodated in the main tank 20 is large and an empty capacity is small and when the amount of the flux is small and the empty capacity is large. The reason is as follows: when the empty capacity in the main tank is large, it takes time to compress the corresponding space, so that the time to be consumed until the flux to be pneumatically transported reaches the predetermined flow rate becomes long, whereas when the empty capacity in the main tank is small, the time to be consumed until the corresponding space is compressed is short, so that the time to be consumed until the flux to be pneumatically transported reaches the predetermined flow rate becomes short. Therefore, a flux applying apparatus 200 of a second illustrative embodiment is configured to adjust a pressure upon the start of the pneumatic transportation of the flux, based on a liquid surface height of the flux in the main tank 20.

Figure 7:
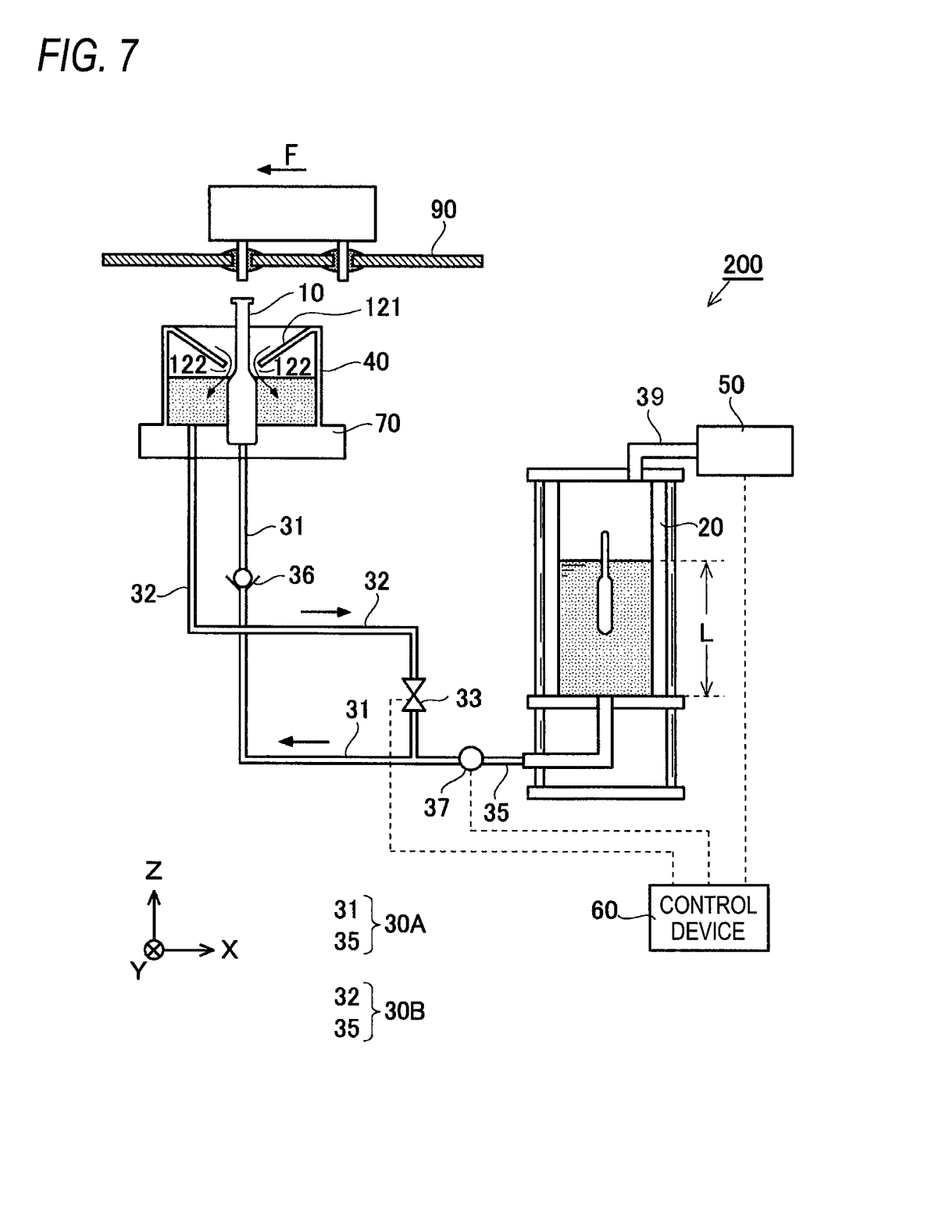
FIG. 7 depicts a configuration of a flux applying apparatus in accordance with a second illustrative embodiment.

FIG. 7 depicts a configuration of the flux applying apparatus of the second illustrative embodiment. The second illustrative embodiment is different from the first illustrative embodiment with respect to the configuration of adjusting the pressure upon the start of the pneumatic transportation of the flux and the other configurations are the same. Therefore, the same elements are denoted with the same reference numerals and the overlapping descriptions thereof are omitted.

As shown in FIG. 7, the flux applying apparatus 200 of the second illustrative embodiment has a pressure sensor 37 on the way of the piping 35 and is configured to measure a pressure (liquid pressure) to be applied to the flux in the piping 35. When the main tank 20 is at the atmospheric pressure without being sealed, the liquid pressure in the piping 35 is proportional to a height L of the liquid surface (upper surface) of the flux accommodated in the main tank 20. That is, it is possible to assume that when the liquid pressure in the piping 35 is high, the height L of the liquid surface is high and the empty capacity in the main tank 20 is small, and that when the liquid pressure in the piping 35 is low, the height L of the liquid surface is low and the empty capacity in the main tank 20 is large.

Therefore, the pressurization control unit 61 of the control device 60 is configured to calculate an initial pressure upon the pressurization in the main tank 20, based on a liquid pressure Pe in the piping 35 at a state (atmospheric pressure state) where the inside of the main tank 20 is neither pressurized nor depressurized. Regarding a relation between the liquid pressure Pe in the piping 35 and the initial pressure, a relation equation or a data table is beforehand prepared and stored in the memory 602, and the pressurization control unit 61 is configured to calculate the initial pressure corresponding to the liquid pressure Pe in the piping 35 on the basis of the relation equation or the data table. For example, the initial pressure Ps is calculated on the basis of a following equation 2.

(initial pressure $Ps$)=(coefficient $h$)÷(liquid pressure $Pe$)×(coefficient $w$) (equation 2)

The necessary initial pressure Ps changes by a variety of factors such as sizes and shapes of the main tank 20 and the piping, a height to the nozzle 10, a flow path resistance of the piping and the like. Therefore, the coefficient h and the coefficient w are preferably determined by measuring a time period after the pressurization is enabled to actually start until the flux reaches a prescribed jetting amount.

Specifically, when the internal capacity of the main tank is an inner diameter $\phi$70 mm×a height 200 mm, the liquid pressure Pe in the piping 35 is 1.51 kpa at the liquid surface height L of 140 mm at a state (atmospheric pressure state) where the inside of the main tank is neither pressurized nor depressurized and the liquid pressure Pe in the piping 35 is 1.28 kpa at the liquid surface height L of 110 mm, the initial pressure Ps is calculated with the coefficient h of 2.7 and the coefficient w of 2.8, as follows.

2.7÷1.51×2.8=5.0 kPa (liquid pressure is 1.15 kPa)

2.7÷1.28×2.8=5.9 kPa (liquid pressure is 1.28 kPa)

Like this, the lower the liquid pressure, the initial pressure Ps becomes higher.

The liquid pressure at the state (atmospheric pressure state) where the inside of the main tank is neither pressurized nor depressurized is substantially proportional to the liquid surface height L. That is, the low liquid pressure indicates that the liquid surface height L of the main tank is low and the empty capacity is large. Therefore, when the initial pressure Ps is set high so as to rapidly compress the space in the main tank, the time that is to be consumed until the flux to be pneumatically transported reaches a predetermined flow rate can be made to be equivalent to a case where the liquid surface height L is high and the empty capacity is small. In this way, it is possible to make the time constant, which is to be consumed until the flux reaches the predetermined flow rate, irrespective of the liquid surface height L reserved in the main tank 20.

Figure 8:
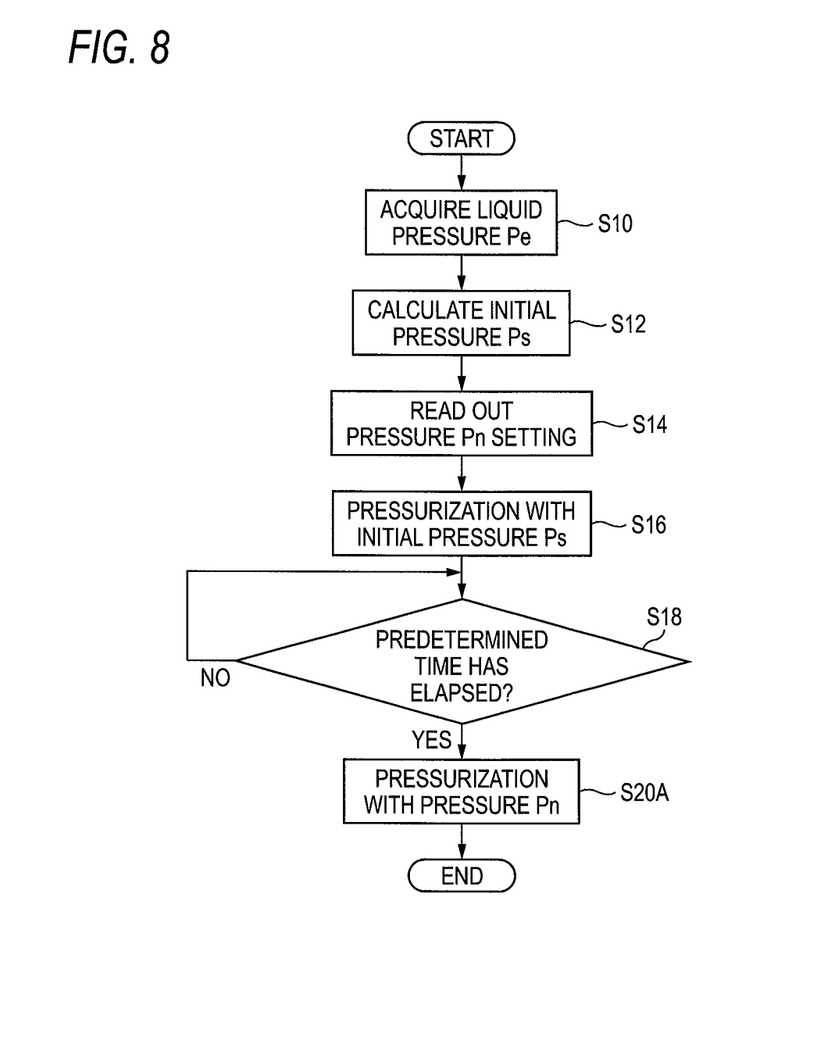
FIG. 8 illustrates processing of starting a pressurization process by the control device in accordance with the second illustrative embodiment.

FIG. 8 illustrates processing of starting the pressurization by the control device 60 of the second illustrative embodiment. The control device 60 executes the processing of FIG. 8 when it is notified from the movement unit that the nozzle 10 has reached a predetermined applying position.

First, the control device 60 acquires the liquid pressure Pe in the piping 35 from the pressure sensor 37 (step S10). At this time, the main tank 20 is at the state (atmospheric pressure state) where it is neither pressurized nor depressurized. Based on the liquid pressure Pe, the control device 60 calculates the initial pressure Ps (step S12). Then, the control device 60 reads out, from the memory 602, a setting of the normal pressure Pn for pressurizing the main tank 20 (step S14).

Subsequently, the control device 60 transmits a control signal to the pressurization/depressurization device 50 so as to perform the pressurization with the initial pressure Ps, thereby starting the pressurization (step S16). After the air in the main tank 20 is pressurized by the initial pressure, the control device 60 determines whether predetermined time ts from the start of the pressurization has elapsed. When the predetermined time ts has not elapsed, the control device 60 continues the pressurization at the initial pressure Ps, and when the predetermined time ts has elapsed, the control device 60 proceeds to a next step (step S18). In the meantime, as the predetermined time ts, a value such as Ts=1 second may be preset from an actually measured result of time after the pressurization starts until the flux reaches a predetermined jetting amount. In a next step, the control device 60 controls the pressurization/depressurization device 50 so as to perform the pressurization with the normal pressure Pn read in step S14 (step S20A). When the inside of the main tank is once pressurized and the jetting of the flux starts, it is possible to continuously jet the flux of a predetermined flow rate sufficiently even with a pressure lower than the initial pressure Ps. Therefore, after the jetting of the flux reaches the predetermined flow rate, the control device 60 controls the pressurization force with the pressure Pn lower than the initial pressure so as to keep the predetermined jetting amount. In the meantime, regarding the pressure Pn, an actual jetting amount of the flux may be measured and a value such as Pn=4 kPa may be preset so that the jetting amount becomes a predetermined value.

By the above control, when the liquid surface height L is low, the initial pressure Ps is increased, and when the liquid surface height L is high, the initial pressure Ps is lowered. Thereby, the correction is made so that the time after the pressurization starts until the jetting amount reaches the predetermined value is constant even when the liquid surface height L has changed. In the meantime, the processing that is to be executed after the pressurization starts, like FIG. 8, is the same as FIGS. 5 and 6.

According to the second illustrative embodiment, the initial pressure Ps is controlled in correspondence to the liquid surface height L in the main tank upon the start of the pneumatic transportation. Thereby, even when the liquid surface height L is low, it is possible to shorten the time that is to be consumed until the flux reaches the predetermined flow rate, so that it is possible to speed up the manufacturing process.

Also, the initial pressure Ps is controlled, so that even when the liquid surface height L has changed, the time after the pressurization starts until the jetting amount reaches the predetermined value is constant. Therefore, it is possible to correctly calculate the jetting time t from the pressurization time and to precisely collect the necessary amount of flux by the negative pressure generation time T calculated on the basis of the jetting time t.

Modified Embodiments

In the above illustrative embodiments, the pressure Pn is constant. However, for example, the pressure Pn may be varied in correspondence to the liquid surface height L of the main tank 20. When the liquid surface height L changes, since a head (water head) from the liquid surface to the nozzle changes, the jetting amount may be changed even though the pressurization is performed with the same pressure Pn. Therefore, the pressure Pn is adjusted in correspondence to the liquid surface height L so that the jetting amount is kept constant. Specifically, the pressure Pn may also be varied, like the initial pressure Ps, on the basis of a table or an equation in correspondence to the liquid pressure at the state (atmospheric pressure state) where the inside of the main tank is neither pressurized nor depressurized. In this case, values preserved in the table or coefficients of equations may also be preset from an observation result of actual jetting amounts for a plurality of liquid pressure values, like the initial pressure Ps. When reading the pressure Pn in step S14 of FIG. 8, the control device 60 may read out the pressure Pn based on the liquid pressure Pe obtained in step S10, on the basis of the table or equation.

By the above control, when the liquid surface height L is low, the normal pressure Pn is increased, and when the liquid surface height L is high, the pressure Pn is decreased. Thereby, the correction is made so that the time after the pressurization starts until the jetting amount reaches the predetermined value is constant even when the liquid surface height L has changed.

Third Illustrative Embodiment

In the second illustrative embodiment, the initial pressure Ps is adjusted in correspondence to the liquid pressure Pe. In a third illustrative embodiment, the pressurization is performed with the predetermined initial pressure Ps until the liquid pressure Pe reaches a target pressure value. Since the other configurations are the same as the second illustrative embodiment, the same elements are denoted with the same reference numerals and the overlapping descriptions are omitted.

As described above, when the empty capacity in the main tank 20 is large, it takes time to compress the air in the empty space upon the start of the pressurization by the pressurization/depressurization device 50, so that the time until the flux reaches the predetermined flow rate is lengthened. Therefore, the control device 60 of the third illustrative embodiment is configured to shorten the time, which is to be consumed to compress the empty space, by starting the pressurization with a high initial pressure Ps. At this time, when the empty capacity in the main tank 20 is large, the time until the flux reaches the predetermined flow rate is highly shortened. On the other hand, when the empty capacity in the main tank 20 is small, the time until the flux reaches the predetermined flow rate is a little shortened. For this reason, when the pressurization is enabled to start with the high initial pressure Ps, it is possible to reduce a difference between the times until the flux reaches the predetermined flow rate, even though the empty capacity in the main tank 20 is different. Herein, the initial pressure Ps may be any pressure higher than the normal pressure Pn and may be arbitrarily set depending on desired specifications. For example, the time after the pressurization is enabled to start until the flux reaches a prescribed flow rate is measured for each pressure value, and when the empty capacity is large and when the empty capacity is small, the initial pressure Ps may be determined as a pressure value at which a time difference can be ignored.

Figure 9:
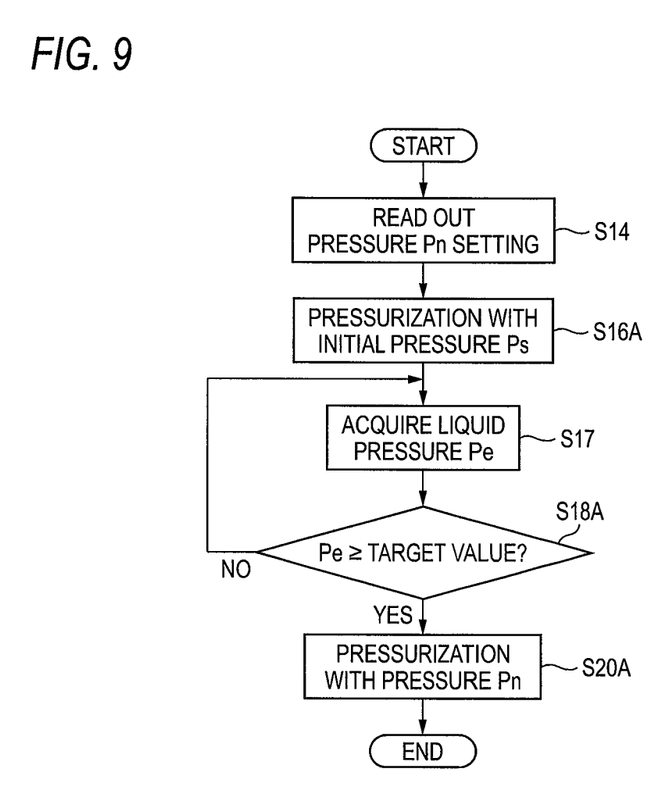
FIG. 9 illustrates processing of starting the pressurization process by the control device in accordance with a third illustrative embodiment.

FIG. 9 illustrates processing of starting the pressurization by the control device 60 of the third illustrative embodiment. First, the control device 60 reads out the setting of the normal pressure Pn for pressurizing the main tank 20 from the memory 602 (step S14).

Then, the control device 60 transmits a control signal to the pressurization/depressurization device 50 so as to perform the pressurization with a predetermined initial pressure Ps (for example, 15 kPa), thereby starting the pressurization (step S16A). Also, the control device 60 acquires the liquid pressure Pe in the piping 35 from the pressure sensor 37 (step S17). Then, the control device 60 determines whether the liquid pressure Pe has reached a target value (for example, 6 kPa) (step S18A). When the empty space in the main tank 20 is compressed with the initial pressure Ps and the pressurization force by the pressurization/depressurization device 50 is transmitted to the flux, the liquid pressure Pe in the piping 35 increases. Therefore, it is possible to determine whether the empty space has been sufficiently compressed, depending on whether the liquid pressure Pe has reached the target value (threshold value). Herein, when it is determined that the liquid pressure Pe has not reached the target value (threshold value) (step S18A, No), the control device 60 returns to step S17 and continues the pressurization with the initial pressure Ps. When it is determined that the liquid pressure Pe has reached the target value (threshold value) (step S18A, Yes), the control device 60 proceeds to a next step (step S18).

Then, the control device 60 controls the pressurization/depressurization device 50 so as to perform the pressurization with the normal pressure Pn (for example, 5 kPa) read in step S14 (step S20A). In the meantime, the processing that is to be executed after the pressurization is enabled to start with the normal pressure Pn is the same as FIGS. 5 and 6.

As described above, according to the third illustrative embodiment, the pressurization is enabled to start with the high initial pressure Ps, so that the air of the empty space in the main tank 20 is rapidly compressed. Thereby, even when the empty capacity in the main tank 20 is large, i.e., even when the liquid surface height L is low, it is possible to shorten the time until the flux reaches the flow rate, which contributes to the speed-up of the manufacturing process.

Also, the pressurization is enabled to start with the high initial pressure Ps, so that the time after the pressurization starts until the jetting amount reaches the predetermined value is substantially constant even though the liquid surface height L has changed. Therefore, it is possible to correctly obtain the jetting time t from the pressurization time and to precisely collect the necessary amount of flux by the negative pressure generation time T calculated on the basis of the jetting time t.

Modified Embodiments

In step S20A of the third illustrative embodiment, the pressure Pn is a constant value. However, the pressure Pn by the pressurization/depressurization device 50 may be adjusted so that the liquid pressure Pe becomes a normal target value (for example, 5 kPa), for example. Thereby, the control can be performed so that the time after the pressurization starts until the jetting amount reaches the predetermined value is constant even though the liquid surface height L in the main tank 20 has changed.

Also, like the modified embodiment of the second illustrative embodiment, the pressure Pn may be adjusted in correspondence to the liquid surface height L so that the jetting amount is kept constant. Specifically, the pressure Pn may be varied on the basis of a table or an equation, in correspondence to the liquid pressure Pe at the state (atmospheric pressure state) where the inside of the main tank 20 is neither pressurized nor depressurized. In this case, values preserved in the table or coefficients of equations may also be preset from an observation result of actual jetting amounts for a plurality of liquid pressure values, like the above-described modified embodiment. For example, when starting the processing of FIG. 9, the control device 60 may acquire the liquid pressure Pe in the piping 35 from the pressure sensor 37 at the state (atmospheric pressure state) where the inside of the main tank 20 is neither pressurized nor depressurized, like step S10 of FIG. 8, and then read out the pressure Pn based on the liquid pressure Pe obtained in step S10, on the basis of the table or equation, when reading the pressure Pn in step S14.

Although the illustrative embodiments of the disclosure have been described, the illustrative embodiments are just exemplary and the disclosure is not limited thereto. That is, a variety of changes can be made on the basis of knowledge of one skilled in the art, without departing from the gist of the claims.

What is claimed is:

1. A flux applying apparatus configured to jet and apply a flux to a target, the flux applying apparatus comprising:
a main tank configured to accommodate therein the flux;
a pressurization and depressurization device that is coupled to the main tank,
a feed pipe configured to pass therethrough the flux which is to be pneumatically transported with a gas pressure when an inside of the main tank is at a positive pressure;
a nozzle configured to jet the flux transported via the feed pipe;
a sub-tank configured to trap therein the flux jetted from the nozzle;
a return pipe configured to communicate the sub-tank with the main tank and to return the flux to the main tank with the gas pressure when the inside of the main tank is at a negative pressure; and
a control unit configured to estimate a flux amount trapped in the sub-tank on the basis of a time period for which the flux is to be jetted from the nozzle and to set a time period for which the inside of the main tank is set to the negative pressure on the basis of the estimated flux amount, when collecting the flux trapped in the sub-tank to the main tank, the control unit coupled to the main tank and further configured to:
pressurize the main tank with the gas pressure via the pressurization and depressurization device to the positive pressure to pneumatically transport the flux via the feed pipe; and
depressurize the main tank with the gas pressure via the pressurization and depressurization device to the negative pressure to return the flux to the main tank.

2. The flux applying apparatus of claim 1 wherein the control device is connected to an opening and closing valve.

3. The flux applying apparatus of claim 2 wherein the opening and closing valve is electromagnetic.

4. The flux applying apparatus of claim 1, further comprising a check valve, which allows the flux to follow from the sub-tank to the main tank and prevents the flux to flow from the main tank to the sub-tank.

* * * * *

UNITED STATES PATENT AND TRADEMARK OFFICE
CERTIFICATE OF CORRECTION

PATENT NO. : 10,434,592 B2
APPLICATION NO. : 15/620031
DATED : October 8, 2019
INVENTOR(S) : Hisaki Hayashi Page 1 of 1

It is certified that error appears in the above-identified patent and that said Letters Patent is hereby corrected as shown below:

In the Claims

Column 14, Claim 1:
"main tank,"
Should read:
--main tank;--

Column 15, Claim 4:
"flux to follow"
Should read:
--flux to flow--

Signed and Sealed this
Fourteenth Day of July, 2020

Andrei Iancu
*Director of the United States Patent and Trademark Office*